United States Patent
Sundararajan et al.

(10) Patent No.: US 8,725,748 B1
(45) Date of Patent: May 13, 2014

(54) METHOD AND SYSTEM FOR STORING AND RETRIEVING SEMICONDUCTOR TESTER INFORMATION

(75) Inventors: Srikanth Sundararajan, Sunnyvale, CA (US); Siu May Ho, Sunnyvale, CA (US); Shivananda S. Shetty, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1519 days.

(21) Appl. No.: 10/929,038

(22) Filed: Aug. 27, 2004

(51) Int. Cl.
*G06F 17/30* (2006.01)

(52) U.S. Cl.
USPC ............ 707/756; 707/760; 707/769; 707/812

(58) Field of Classification Search
USPC ........... 707/1, 3, 4, 103 Y, 769, 756, 760, 812
See application file for complete search history.

(56) References Cited

U.S. PATENT DOCUMENTS

| | | | | |
|---|---|---|---|---|
| 5,668,745 A * | 9/1997 | Day | ............................ | 702/121 |
| 5,889,674 A * | 3/1999 | Burdick et al. | ............... | 700/121 |
| 5,913,022 A * | 6/1999 | Tinaztepe et al. | ............... | 714/25 |
| 6,381,604 B1 * | 4/2002 | Caughran et al. | ...................... | 1/1 |
| 6,480,979 B1 * | 11/2002 | Tomari | .......................... | 714/724 |
| 6,513,043 B1 * | 1/2003 | Chan et al. | .................... | 707/802 |
| 6,617,842 B2 * | 9/2003 | Nishikawa et al. | ......... | 324/158.1 |
| 6,620,204 B1 * | 9/2003 | Malcolm | ........................ | 715/513 |
| 6,826,735 B2 * | 11/2004 | Ono et al. | .......................... | 716/4 |
| 6,857,090 B2 * | 2/2005 | Lee et al. | ....................... | 714/724 |
| 6,892,328 B2 * | 5/2005 | Klein et al. | ..................... | 714/42 |
| 6,944,553 B2 * | 9/2005 | Minch | .............................. | 702/58 |
| 6,948,140 B2 * | 9/2005 | Parker et al. | ...................... | 716/4 |
| 7,013,425 B2 * | 3/2006 | Kataoka | ......................... | 715/513 |
| 7,047,174 B2 * | 5/2006 | Koh et al. | ........................ | 703/14 |
| 7,167,811 B2 * | 1/2007 | Tabor | ............................ | 702/183 |
| 7,209,851 B2 * | 4/2007 | Singh et al. | ................... | 702/119 |
| 7,237,231 B2 * | 6/2007 | Lambert | ....................... | 717/127 |
| 7,240,338 B1 * | 7/2007 | Bell et al. | ....................... | 717/137 |
| 7,272,822 B1 * | 9/2007 | Riggins et al. | ................ | 717/124 |
| 7,979,355 B2 * | 7/2011 | Shah et al. | ........................ | 705/51 |
| 8,065,399 B2 * | 11/2011 | McFate et al. | ................ | 709/221 |
| 2002/0007285 A1 * | 1/2002 | Rappaport | ......................... | 705/2 |
| 2003/0005376 A1 * | 1/2003 | Lee et al. | ....................... | 714/724 |
| 2003/0014205 A1 * | 1/2003 | Tabor | ............................. | 702/84 |
| 2004/0006447 A1 * | 1/2004 | Gorin | ............................. | 702/181 |
| 2004/0039812 A1 * | 2/2004 | Connelly et al. | .............. | 709/224 |
| 2004/0083407 A1 * | 4/2004 | Song et al. | ....................... | 714/27 |
| 2004/0111676 A1 * | 6/2004 | Jang et al. | ....................... | 715/513 |
| 2004/0143819 A1 * | 7/2004 | Cheng et al. | ................... | 717/125 |
| 2004/0151362 A1 * | 8/2004 | Hamaguchi et al. | .......... | 382/145 |
| 2004/0162682 A1 * | 8/2004 | Burke et al. | ..................... | 702/57 |
| 2005/0044110 A1 * | 2/2005 | Herzenberg et al. | ........ | 707/104.1 |
| 2005/0071274 A1 * | 3/2005 | Pfaff et al. | ........................ | 705/51 |
| 2005/0086579 A1 * | 4/2005 | Leitner et al. | .................. | 715/500 |

(Continued)

OTHER PUBLICATIONS

"XML Takes the Field", Nelson King, DBMS online Net Developer, May 1998, http://www.dbmsmag.com/9805d18.html.*

*Primary Examiner* — Thanh-Ha Dang

(74) *Attorney, Agent, or Firm* — Farjami & Farjami LLP

(57) ABSTRACT

A tester information tester information processing system provides test equipment for generating test data. A markup language encoder connected to the test equipment encodes the test data for storage in an object-oriented database management system connected to the markup language encoder, and a user interface is operatively connected to the object-oriented database management system for retrieval of the test data.

20 Claims, 2 Drawing Sheets

(56) References Cited

U.S. PATENT DOCUMENTS

2005/0086639 A1* 4/2005 Min et al. .................. 717/114
2005/0154551 A1* 7/2005 Pramanick et al. ........... 702/119
2005/0188271 A1* 8/2005 West et al. .................. 714/38
2005/0198086 A1* 9/2005 Moore et al. ................ 707/204
2005/0273685 A1* 12/2005 Sachdev et al. .............. 714/742
2006/0235862 A1* 10/2006 Heuer et al. ................. 707/101

* cited by examiner

METHOD AND SYSTEM FOR STORING AND RETRIEVING SEMICONDUCTOR TESTER INFORMATION

BACKGROUND

1. Technical Field

The present invention relates generally to semiconductor technology and more specifically to semiconductor research and development.

2. Background Art

Electronic products are used in almost every aspect of life, and the heart of these electronic products is the integrated circuit. Integrated circuits are used in a wide variety of products, such as televisions, telephones, and appliances.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each worth hundreds or thousands of dollars.

The ideal would be to have every one of the integrated circuits on a wafer functional and within specifications, but because of the sheer numbers of processes and minute variations in the processes, this rarely occurs. "Yield" is the measure of how many "good" integrated circuits there are on a wafer divided by the total number of integrated circuits formed on the wafer divided by the maximum number of possible good integrated circuits on the wafer. A 100% yield is extremely difficult to obtain because minor variations, due to such factors as timing, temperature, and materials, substantially affect a process. Further, one process often affects a number of other processes, often in unpredictable ways.

In a manufacturing environment, the primary purpose of experimentation is to increase the yield. Experiments are performed in-line and at the end of the production line with both production wafers and experimental wafers. However, yield enhancement methodologies in the manufacturing environment produce an abundance of very detailed data for a large number of wafers on processes subject only to minor variations. Major variations in the processes are not possible because of the time and cost of using production equipment and production wafers. Setup times for equipment and processing time can range from weeks to months, and processed wafers can each contain hundreds of thousands of dollars worth of integrated circuits.

The learning cycle for the improvement of systems and processes requires coming up with an idea, formulating a test(s) of the idea, testing the idea to obtain data, studying the data to determine the correctness of the idea, and developing new ideas based on the correctness of the first idea. The faster the correctness of ideas can be determined, the faster new ideas can be developed. Unfortunately, the manufacturing environment provides a slow learning cycle because of manufacturing time and cost.

Recently, the great increase in the complexity of integrated circuit manufacturing processes and the decrease in time between new product conception and market introduction have both created the need for speeding up the learning cycle.

This has been accomplished in part by the unique development of the integrated circuit research and development environment. In this environment, the learning cycle has been greatly speeded up and innovative techniques have been developed that have been extrapolated to high volume manufacturing facilities.

To speed up the learning cycle, processes are speeded up and major variations are made to many processes, but only a few wafers are processed to reduce cost. The research and development environment has resulted in the generation of tremendous amounts of data and analysis for all the different processes and variations. This, in turn, has required a large number of engineers to do the analysis. With more data, the answer always has been to hire more engineers.

However, this is not an acceptable solution for major problems.

The problems include, but are not limited to, the storage and retrieval of the large amounts of data that are generated.

Furthermore, current methods of storing and accessing test data do not provide flexible access to test data on a timely basis.

Thus, there is a need for minimizing testing time requirements during semiconductor fabrication yet maintaining acceptable quality control levels, resulting in lower production cost. Moreover, there is a need for a data storage and retrieval system that can create object-oriented test data documents from the test data generated by the test equipment used during semiconductor processing and fabrication.

Solutions to these problems have been long sought but prior developments have not taught or suggested any solutions and, thus, solutions to these problems have long eluded those skilled in the art.

DISCLOSURE OF THE INVENTION

The tester information processing system of the present invention provides test equipment for generating test data. A markup language encoder connected to the test equipment encodes the test data for storage in an object-oriented database management system connected to the markup language encoder, and a user interface is operatively connected to the object-oriented database management system for retrieval of the test data.

The tester information storage and retrieval system provides the ability to provide test data access on a timely basis while minimizing testing time requirements during semiconductor fabrication yet maintaining acceptable quality control levels, resulting in lower production cost. The tester information storage and retrieval system of the present invention also can create object-oriented test data documents from the test data generated by the test equipment used during semiconductor processing and fabrication.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
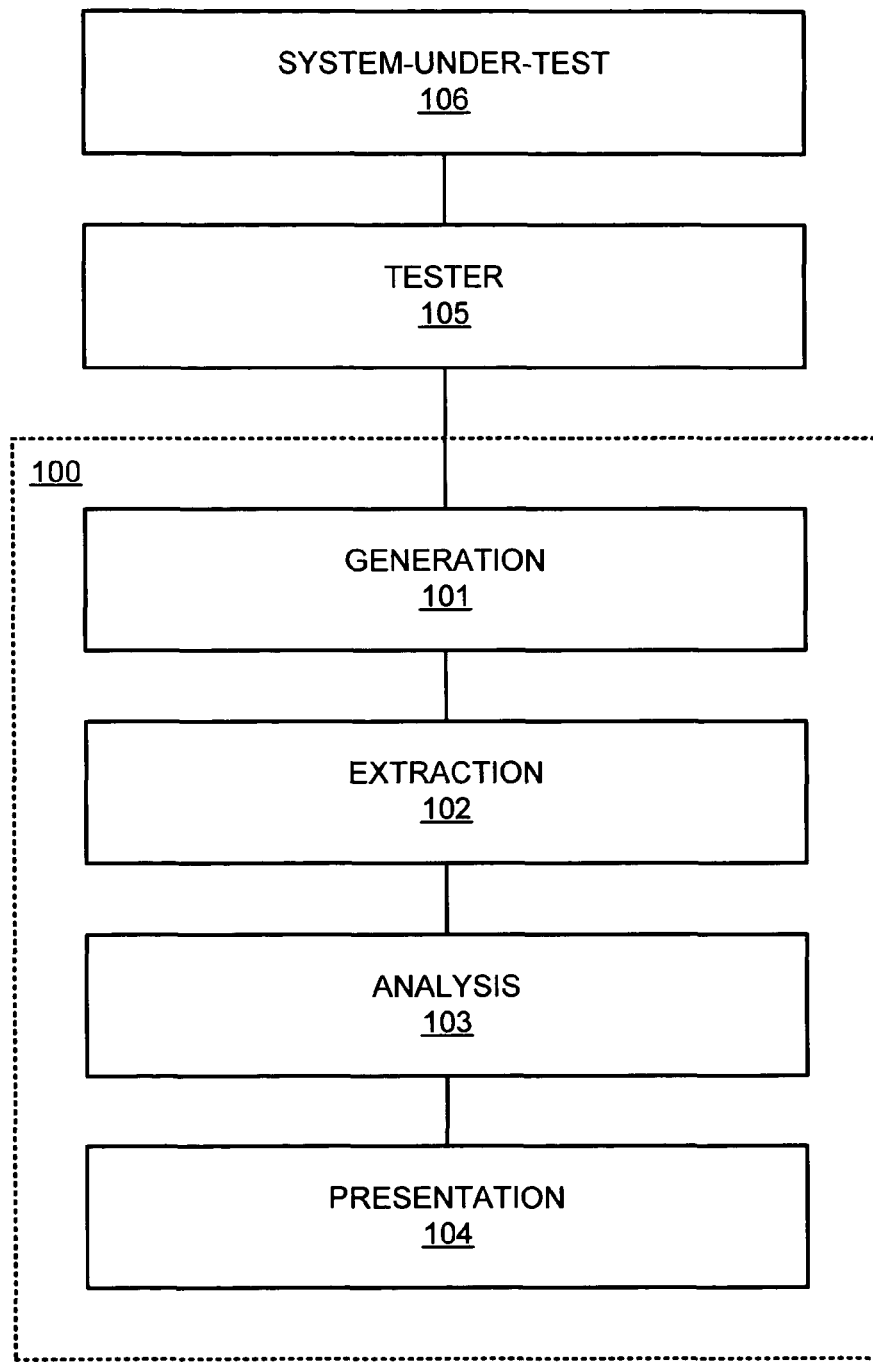
FIG. 1 is a block diagram of a tester information processing system according to the present invention.

Referring now to FIG. 1 therein is shown a block diagram of a tester information processing system 100 according to the present invention. The tester information processing system 100 is the result of the discovery that at times, a single fundamental block can solve the problems presented but often there are four fundamental blocks to solving the problems presented.

The four fundamental blocks are a generation block 101, an extraction block 102, an analysis block 103, and a presentation block 104. Each of the blocks can stand independently in the tester information processing system 100, and within these blocks are various commercially available techniques, methodologies, processes, and approaches as well as the invention disclosed herein. The four fundamental blocks are discussed in the approximate chronology that the blocks are used in the tester information processing system 100.

The tester information processing system 100 includes various pieces of commercially available production, test, research, and development semiconductor equipment, which operate on and manipulate information and/or data, which are generically defined herein as "information." The tester information processing system receives information from a tester 105, which is connected to a system-under-test 106.

In the integrated circuit field, the tester 105 can be a semiconductor test system for testing wafers or die and the system-under-test 106 can be anything from a complete wafer down to an element of an individual semiconductor device on a die.

In the generation block 101, basic information is generated looking at new and old products, new and old processes, product and process problems, unexpected or unpredictable results and variations, etc. Generation of the information may use the tester 105 itself, conventional test information, a personal computer, etc. It may also require new equipment and/or methods, which are described herein when required.

In the extraction block 102, usable information is extracted from the generated information from the generation block 101. Essentially, the generated information is translated into forms that are more useful; e.g., broken apart so it can be reassembled in different forms to show different inter-relationships.

For example, most testing equipment provides raw data in massive test files. Sometimes, millions of measurements provide millions of pieces of information, which must be digested and understood. The test files seldom have a user-friendly tabular output of parameter and value. Even where somewhat user-friendly outputs are provided, there are problems with the proper schema for storing the usable data and for formatting the data for subsequent analysis.

Extraction of the usable information may also require new equipment and/or methods. Sometimes, extraction includes storing the information for long duration experiments or for different experiments, which are described herein when required.

In the analysis block 103, the usable information from the extraction block 102 is analyzed. Unlike previous systems where a few experiments were performed and/or a relatively few data points determined, the sheer volume of experiments and data precludes easy analysis of trends in the data or the ability to make predictions based on the data. Analysis of the extracted information may also require new equipment and/or methods, which are described herein when required.

In the presentation block 104, the analyzed information from the analysis block 103 is manipulated and presented in a comprehensible form to assist others in understanding the significance of the analyzed data. The huge amount of analyzed information often leads to esoteric presentations, which are not useful per se, misleading, or boring. Proper presentation often is an essential ingredient for making informed decisions on how to proceed to achieve yield and processing improvements. In some cases, problems cannot even be recognized unless the information is presented in an easily understood and digested form, and this often requires new methods of presentation, which are described herein when required.

Figure 2:
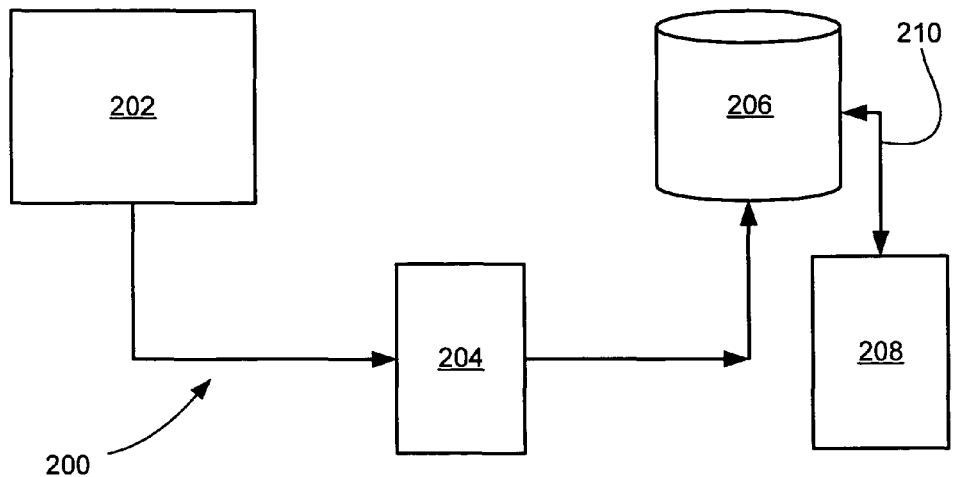
FIG. 2 is a tester information processing system according to the present invention.

Referring now to FIG. 2 therein is shown a tester information processing system 200 according to the present invention for storage and retrieval of test data generated in the generation block 101 shown in FIG. 1. The tester 105 shown in FIG. 1, such as an ATE 202, or automated test equipment, performs a designated test on the system-under-test 106 shown in FIG. 1 to generate test data as shown in the generation block 101 shown in FIG. 1.

The ATE 202 can be in any combination or subcombination of software, firmware, or hardware, which embody the invention and cooperatively function as the tester 105 shown in FIG. 1 that provides quality control data for products, such as semiconductor wafers, being processed.

The ATE 202 can be an electronic testing device that applies stimulus test signals to a semiconductor wafer or chip and reads a resulting output therefrom. Typically, the ATE 202 also can compare the test output to an expected result. The data generated by the ATE 202 may include fabrication in-line defect inspection data, in-line parametric test data, wafer final test results data, historical package final test data, qualification test/stress results data showing correlations between specific fabrication parameters and test failure modes, or various other types of data used for production quality control or failure analysis.

The test data generated by the ATE 202 is received and encoded in an encoder 204, or parser. The encoder 204 creates a document that can be stored in, and retrieved from, a database management system using object-oriented programming language and techniques. It will be apparent that although the encoder 204 is shown in FIG. 2 as a separate element, the encoder 204 also can be integrated into or combined with the ATE 202.

Figure 3:
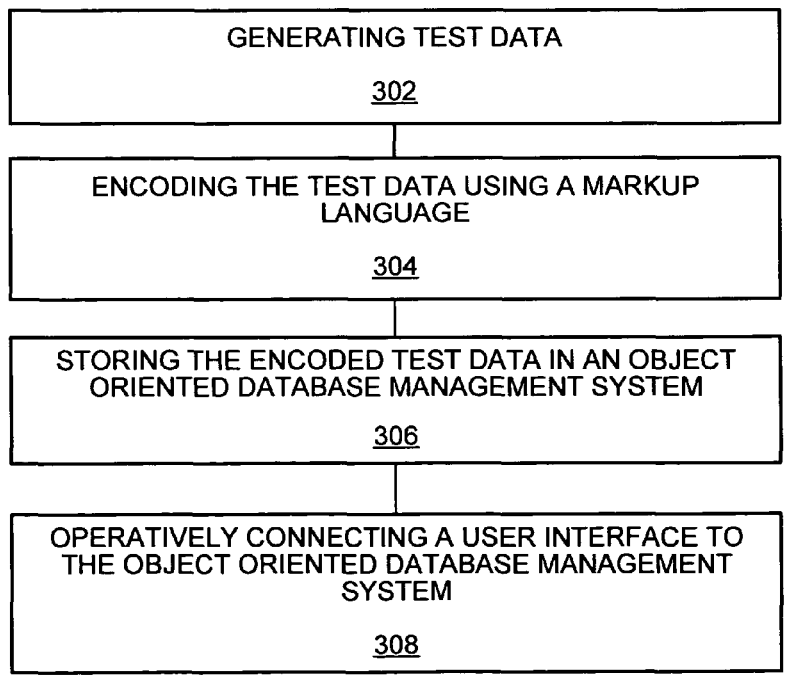
FIG. 3 is a flow chart of a method of the present invention.

Preferably, extensible markup language (XML) is used in the encoder 204 to create an XML document containing the test data generated by the ATE 202. The XML document then is stored in an object-oriented database management system (OODBMS) 206 for subsequent retrieval. The OODBMS 206 is a database management system (DBMS) that supports the modeling and creation of data as objects such as the XML documents encoded in the encoder 204. It will be apparent to those skilled in the art that although the OODBMS 206 is shown in FIG. 3 as a singular database, the OODBMS 206 also can be a distributed database located on several servers connected in a network.

Extensible Mark-up Language (XML), which is a subset of the Standard Generalized Markup Language (SGML), is designed to provide the capability to exchange documents over a network, such as a local area network (LAN), intranet, wide area network (WAN), or the Internet. XML files clearly mark where the start and end of each of the logical parts, or elements, of a document occurs by using a system of tags. For example, the elements could include a title, date, data, production lot identifier, production facility, and other information. The tags indicate what each item of data means (whether it is a <title> element, an <author> element, and so forth). The data in the XML document then can be decoded when retrieved by a user of the tester information processing system 200.

The XML document includes a definition of each element in a formal model, known as a Document Type Definition (DTD). The DTD provides attributes for each element and indicates the relationship of the elements. Elements are arranged in a hierarchical relationship. The DTD defines the hierarchical relationship of the elements to one another and the attributes of the elements.

The XML document is encoded and decoded in accordance with a Document Object Model (DOM) application program interface (API). The DOM API represents the document as a hierarchical arrangement of nodes. When applied to the XML document, each node comprises one of the elements or the attributes of the elements.

XML is "extensible" because the markup symbols, or tags, are not limited to a predefined set, but rather are self-defining through a companion file or document called a Document Type Definition ("DTD"). Additional document data items may be defined by adding them to the appropriate DTD for a class of XML files, thereby "extending" the definition of the class of XML files.

As such, XML is a highly flexible method or definition that allows common information formats to be shared across computer networks.

A user interface 208, such as a computer workstation, a personal computer, a server, a network PC, or other common database access device, is used to search and retrieve the data stored in the OODBMS 206. It has been discovered that use of the OODBMS 206 that stores XML documents increases the flexibility of data acquisition by allowing richer data structures to be defined for accessing the test data generated by the ATE 202.

The user interface 208 includes an XML reader that is used to view the XML documents stored in the OODBMS 206. The XML reader interprets and visually presents the contents of the XML documents. In addition, an intelligent agent program may be dispatched from the user interface 208 looking for the XML documents containing certain data via multiple server computers in the OODBMS 206, which may be distributed over several servers on a computer network. The intelligent agent then can report to the user interface 208 the XML documents that it has found. The XML reader in the user interface 208 processes the XML documents located on the OODBMS 206 searching for particular tags that define the objects within the XML documents.

A connection 210 is used to operatively connect the user interface 208 to the OODBMS 206. The connection 210 comprises at least one of a local connection, a (LAN), a wide area network (WAN), an intranet, the Internet, and combinations thereof. Various networking environments are commonplace in semiconductor production facilities and enterprise-wide computer networks. Analysis of the test data in accordance with the analysis block 103 and presentation of the test data in accordance with the presentation block 104 shown in FIG. 1 can then be performed at the user interface 208.

Referring now to FIG. 3 therein is shown a flow chart of a method 300 of the present invention. The method 300 includes a step 302 of generating test data; a step 304 of encoding the test data using a markup language; a step 306 of storing the encoded test data in an object-oriented database management system; and a step 308 of operatively connecting a user interface to the object-oriented database management system.

The method can be implemented in any combination using standard programming and/or engineering techniques using computer-programming software, firmware, hardware or any combination or sub-combination thereof.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters hither-to-fore set forth or shown in the accompanying drawings are to be interpreted in an illustrative and non-limiting sense.

The invention claimed is:

1. A method for execution by a processor running instructions stored in a memory for storing and retrieving tester information, said method comprising:
    generating raw test data from a tester, said raw test data generated during semiconductor processing;
    receiving, in an encoder, said raw test data generated during semiconductor processing from said tester;
    encoding, in said encoder, said raw test data generated during semiconductor processing, using a markup language, to produce a markup language storage document including encoded test data as object-oriented data;
    storing said encoded test data from said encoder in an object-oriented database management system (OODBMS); and
    retrieving said encoded test data from said OODBMS on a user interface operatively connected to said OODBMS.

2. The method of claim 1, wherein said markup language comprises extensible markup language (XML).

3. The method of claim 1, wherein a Document Type Definition (DTD) defines relationships and attributes of elements of said encoded data.

4. The method of claim 1, wherein said retrieving said encoded test data further comprises an intelligent agent searching for specific data in said encoded test data.

5. The method of claim 1, wherein said tester comprises automated test equipment (ATE).

6. The method of claim 1, wherein said encoder is integrated with said tester.

7. The method of claim 1, wherein said OODBMS comprises a distributed database.

8. The method of claim 1, wherein said user interface includes an XML reader.

9. The method of claim 1, wherein said user interface is operatively connected to said OODBMS using at least one of a local connection, a local area network, a wide area network, an intranet, the Internet, and combinations thereof.

10. The method of claim 1, wherein said raw test data corresponds to semiconductor manufacturing test data.

11. A tester information processing system comprising a processor running instructions stored in a memory, and further comprising:
    a tester generating raw test data, said raw test data generated during semiconductor processing;
    an encoder connected to said tester, said encoder receiving said raw test data generated during semiconductor processing from said tester and encoding said raw test data generated during semiconductor processing, using a markup language, to produce a markup language storage document including encoded test data as object-oriented data;
    an object-oriented database management system (OODBMS) connected to said encoder, said OODBMS storing said encoded test data from said encoder; and
    a user interface operatively connected to said OODBMS, said user interface retrieving said encoded test data from said OODBMS.

12. The tester information processing system of claim 11, wherein said markup language comprises extensible markup language (XML).

13. The tester information processing system of claim 11, wherein a Document Type Definition (DTD) defines relationships and attributes of elements of said encoded data.

14. The tester information processing system of claim 11, wherein said user interface further comprises an intelligent agent searching for specific data in said encoded test data.

15. The tester information processing system of claim 11, wherein said tester comprises automated test equipment (ATE).

16. The tester information processing system of claim 11, wherein said encoder is integrated with said tester.

17. The tester information processing system of claim 11, wherein said OODBMS comprises a distributed database.

18. The tester information processing system of claim 11, wherein said user interface includes an XML reader.

19. The tester information processing system of claim 11, wherein said user interface is operatively connected to said OODBMS using at least one of a local connection, a local area network, a wide area network, an intranet, the Internet, and combinations thereof.

20. The tester information processing system of claim 11, wherein said raw test data corresponds to semiconductor manufacturing test data.

* * * * *